United States Patent
Toncich et al.

(10) Patent No.: US 6,859,104 B2
(45) Date of Patent: Feb. 22, 2005

(54) TUNABLE POWER AMPLIFIER MATCHING CIRCUIT

(75) Inventors: Stanley S. Toncich, San Diego, CA (US); Tim Forrester, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 178 days.

(21) Appl. No.: 10/075,507

(22) Filed: Feb. 12, 2002

(65) Prior Publication Data

US 2002/0149428 A1 Oct. 17, 2002

Related U.S. Application Data

(60) Provisional application No. 60/283,093, filed on Apr. 11, 2001.

(51) Int. Cl.[7] .................................................. H03F 3/04
(52) U.S. Cl. ...................... 330/302; 330/305; 330/306
(58) Field of Search .............................. 330/302, 305, 330/306; 333/32, 33

(56) References Cited

U.S. PATENT DOCUMENTS

| | | |
|---|---|---|
| 3,413,543 A | 11/1968 | Schubring et al. |
| 3,676,803 A | 7/1972 | Simmons |
| 3,678,305 A | 7/1972 | Geroge |
| 3,739,299 A * | 6/1973 | Adler ..................... 331/116 R |
| 3,836,874 A | 9/1974 | Maeda et al. |
| 3,918,012 A | 11/1975 | Pauzin |
| 4,475,108 A | 10/1984 | Moser |
| 4,733,328 A | 3/1988 | Blazej |
| 4,799,066 A | 1/1989 | Deacon |
| 4,835,499 A | 5/1989 | Pickett |
| 5,166,857 A | 11/1992 | Avanic et al. |
| 5,212,463 A | 5/1993 | Babbitt et al. |
| 5,216,392 A | 6/1993 | Fraser et al. |
| 5,307,033 A | 4/1994 | Koscica et al. |
| 5,427,988 A | 6/1995 | Sengupta et al. |
| 5,450,092 A | 9/1995 | Das |
| 5,472,935 A | 12/1995 | Yandrofski et al. |
| 5,496,795 A | 3/1996 | Das |
| 5,557,286 A | 9/1996 | Varadan et al. |
| 5,561,407 A | 10/1996 | Koscica et al. |

(List continued on next page.)

FOREIGN PATENT DOCUMENTS

| | | |
|---|---|---|
| DE | 40 36 866 A1 | 7/1991 |
| EP | 0 637 131 A1 | 2/1995 |
| EP | 0 638 953 A1 | 2/1995 |
| EP | 0 880 108 A1 | 11/1995 |
| EP | 0 795 922 A1 | 9/1997 |
| EP | 0 843 374 A2 | 5/1998 |
| EP | 0 881 700 A1 | 12/1998 |
| EP | 0 909 024 A2 | 4/1999 |
| EP | 1 043 741 A2 | 10/2000 |
| JP | 29-05-00 2001338839 | 7/2001 |
| WO | WO 94/13028 | 6/1994 |
| WO | WO 00/28613 | 5/2000 |
| WO | WO 00/35042 | 6/2000 |
| WO | WO 00/62367 | 10/2000 |
| WO | WO 00/79645 A1 | 12/2000 |
| WO | WO 00/79648 A1 | 12/2000 |

OTHER PUBLICATIONS

A. Presser, "Varactor–Tunable, High–Q Microwave Filter," RCA Review, vol. 42, Dec. 1981, pp. 691–705.

(List continued on next page.)

*Primary Examiner*—Patricia Nguyen

(57) ABSTRACT

A power amplifier matching circuit is provided. The matching circuit includes a ferro-electric tunable component. A control signal is applied to the tunable component, changing the component's impedance. This changes the impedance of the matching circuit.

3 Claims, 15 Drawing Sheets

U.S. PATENT DOCUMENTS

| | | | |
|---|---|---|---|
| 5,589,845 A | | 12/1996 | Yandrofski et al. |
| 5,617,104 A | | 4/1997 | Das |
| 5,640,042 A | | 6/1997 | Koscica et al. |
| 5,729,239 A | | 3/1998 | Rao |
| 5,777,524 A | | 7/1998 | Wojewoda et al. |
| 5,778,308 A | | 7/1998 | Sroka et al. |
| 5,880,921 A | | 3/1999 | Tham et al. |
| 5,945,887 A | | 8/1999 | Makino et al. |
| 5,973,567 A | | 10/1999 | Heal et al. |
| 5,973,568 A | | 10/1999 | Shapiro et al. |
| 5,987,314 A | | 11/1999 | Saito |
| 6,020,787 A | * | 2/2000 | Kim et al. .................. 330/279 |
| 6,028,561 A | | 2/2000 | Takei |
| 6,049,726 A | | 4/2000 | Gruenwald et al. |
| 6,052,036 A | | 4/2000 | Enstrom et al. |
| 6,054,908 A | * | 4/2000 | Jackson ..................... 333/174 |
| 6,097,263 A | | 8/2000 | Mueller et al. |
| 6,101,102 A | * | 8/2000 | Brand et al. .................. 363/15 |
| 6,160,524 A | | 12/2000 | Wilber |
| 6,198,441 B1 | | 3/2001 | Okabe et al. |
| 6,292,143 B1 | | 9/2001 | Romanofsky |
| 6,333,719 B1 | | 12/2001 | Varadan |

OTHER PUBLICATIONS

C. Chang and T. Itoh, "Microwave Active Filters Based on Coupled Negative Resistance Method," IEEE Trans. on Microwave Theory and Techniques, vol. 27, No. 12, Dec. 1990, pp. 1879–1884.

P. Katzin, B. Bedard, and Y. Ayasil, "Narrow–Band MMIC Filters with Automatic Tuning and Q–Factor Control," 1993 IEEE MTT–S Int. Microwave Symp. Digest pp. 403–406.

B. Hopf, I. Wolff, and M. Gugllemi, "Coplanar MMIC Active Bandpass Filters Using Negative Resistance Circuits," 1994 IEEE MTT–S Symposium Digest, pp. 1183–1185.

U. Karaceoglu and I.D. Robertson, "High Selectivity Veractor–Tuned MMIC Bandpass Filter Using Losslass Active Resonators,"1994 IEEE MTT–Symposium Digest, pp. 1191–1194.

B. Nauta, "A CMOS Transconductance–C Filter Techniques for Very High Frequencies," IEEE Journal of Solid–State Circuits, vol. 27, No. 2, Feb. 1992, pp. 142–153.

K Fujita, H. Itoh, R. Yamamoto, "A 15.6 GHz Commerically Based 1/8 GaAs Dynamic Presealer," 1989 IEEE GaAs IC Symposium, pp. 113–116.

J. Smuk, P. Katzin, "MMIC Phase Locked L–S Band Oscillators," 1994 IEEE GaAs Symposium Digest, pp. 27–29.

S. R. Chandler, I. C. Hunter, and J.G. Gardiner, "Active Veractor Tunable Bandpass Filter," IEEE Microwave and Guided Wave Letters, vol. 3, No. 3, Mar. 1993, pp. 70–71.

I. C. Hunter and John D. Rhodes, "Electonrically Tunable Microwave Bandpass Filters," IEEE Trans. on MTT, vol. 30, No. 9, Sep. 1982, pp. 1354–1367.

S. Toyeda, "Quarter–wavelength Coupled Varable Bandstop and Bandpass Filters Using Varactor Diodes," IEEE Trans, on Mtt, vol. 30, No. 9, Sep. 1982, pp. 1387–1389.

B. Yu, Kapilevich, "Variety of Approaches to Designing Microwave Active Filters," Proc. 27th European Microwave Conf., Jerusalem, vol. 1, 1997, pp. 397–408.

B. Yu, Kapilevich, "Understand the Operation of Channellzed Active Filters," Microwave & RF, Jan. 1997, pp. 89–92.

M. Dishal; "Alignment and Adjustment of Synchronously Tuned Multiple Resonator–Circuit Filters" Proc. IRE 39, Nov. 1951, pp. 1448–1455.

S. B. Cohn "Dissipation Loss in Multiple–Coupled Resonator Filters," Proc. IRE 47, Aug. 1959, pp. 1342–1348.

G. L. Matthael, "An Electronically Tunable Up–Converter," Proc. IRE 49, Nov. 1961, pp. 1703–1704.

E. G. Fubini and E.A. Guillerrin, "Minimum Insertion Loss Filters," Proc. 47, Jan. 1959, pp. 37–41.

W.J. Getsinger,"Prototypes for Use In Broadbanding Reflection Amplifiers," IEEE Trans. PTGMTT–11, Nov. 1963, pp. 486–497.

E.S. Kuh and M. Fukada, "Optimum Sunthesis of Wide––Band Parametric Amplifiers and Converters," IRE Trans, PCCT–8, Dec. 1961, pp. 410–415.

W. J. Getsinger and G.L. Matthaei, "Some Aspects of the Design of Wide–Band Up–Converters and Nondegenerate Perametic Amplifiers," IEEE Trans. PTGMTT–12, Jan. 1964, pp. 77–87.

R. L. Slevan, "Design of a Tunable Multi–Cavity Waveguide Band–pass Filter," 1959 IRE National Convention Record, Part 3, pp. 91–112.

J.J. Taub and B. F. Bogner, "Design of Three–Resonator Dissipative Band–Pass Filters Having Minimum Insertion Loss, "Proc. IRE 45, pp. 681–687 (May 1957).

K.L. Kotzebue, "Broadband Electronically–Tunable Microwave Filters," 1960 IRE Wescon Convention Record, Part 1, pp. 21–27.

J.P. Louhos and I. Pankinaho, "Electrical Tuning of Integrated Mobile Phone Antennas," Nokia Mobile Phones, pp. 69–97 (Sep. 15, 1999).

P. K. Panayl, M. Al–Nusimi, and L.P. Ivrissimtzis, "Tuning Techniques for the Planar Inverted–F Antenna," National Conference on Antennas and Propagation Publication, No. 461, pp. 259–262 (Apr. 1999).

Satoshi Maldoka, et al, "A High Efficiency GaAs MCM Power Amplifier for 1.9 GHz Digital Cordless Telephones," IEEE 1994 Microwave and Millimeter–Wave Monolithic Circuits Symposium, pp. 51–54 (1994).

V. K. Varadan, K. A. Jose, V. V. Varadan, "Design and Development of Electronically Tunable Microstrip Antennas," IOP Publishing Ltd., pp. 238–242 (1999).

Communication Relating to the Results of the Partial International Search: PCT/IB 02/01077 (2002).

International Search Report: PCT/IB 02/01086 (Jun. 24, 2002).

International Search Report: PCT/IB 02/01078 (Jul. 10, 2002).

International Search Report: PCT/IB 02/01087 (Jul. 19, 2002).

International Search Report: PCT/IB 02/01107 (Jul. 11, 2002).

International Search Report: PCT/IB 02/01120 (Jul. 11, 2002).

International Search Report: PCT/IB 02/01098 (Jul. 4, 2002).

International Search Report: PCT/IB 02/01082 (Jul. 8, 2002).

International Search Report: PCT/IB 02/01144 (Jul. 12, 2002).

International Search Report: PCT/IB 02/01026 (Jun. 28, 2002).

International Search Report: PCT/IB 02/01027 (Jun. 25, 2002).

* cited by examiner

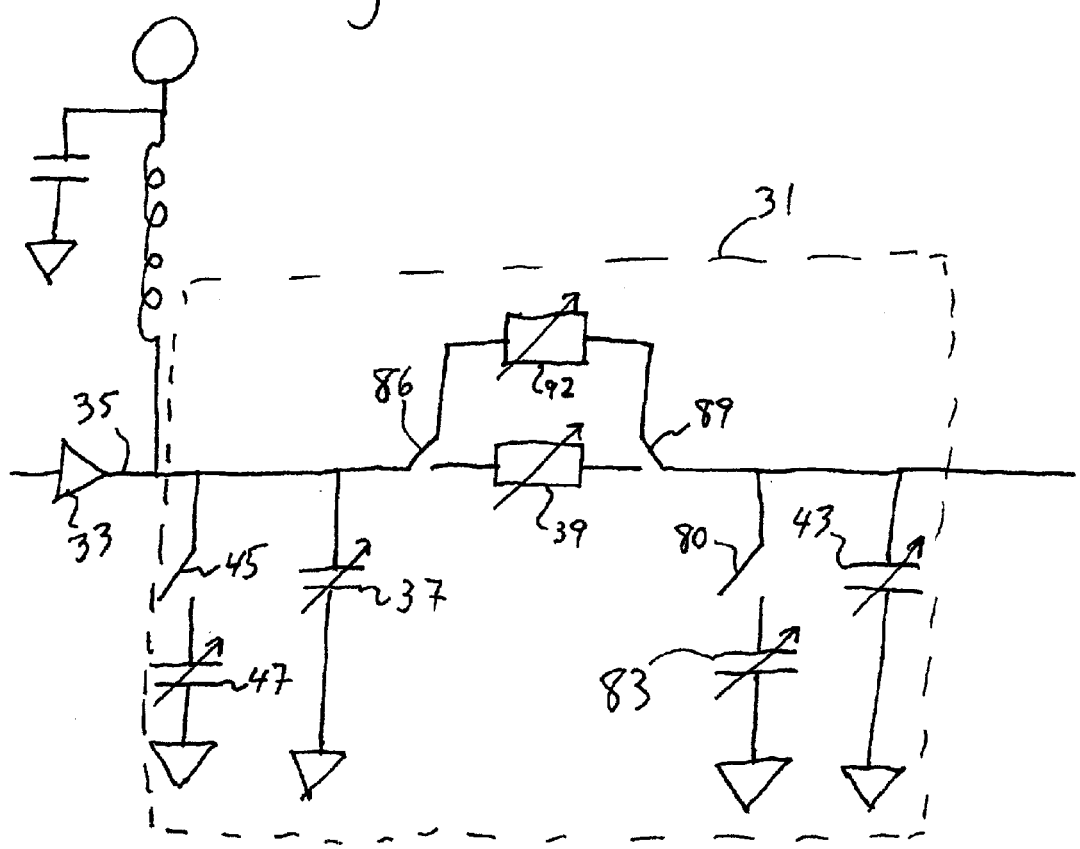

LNA Matching Circuit

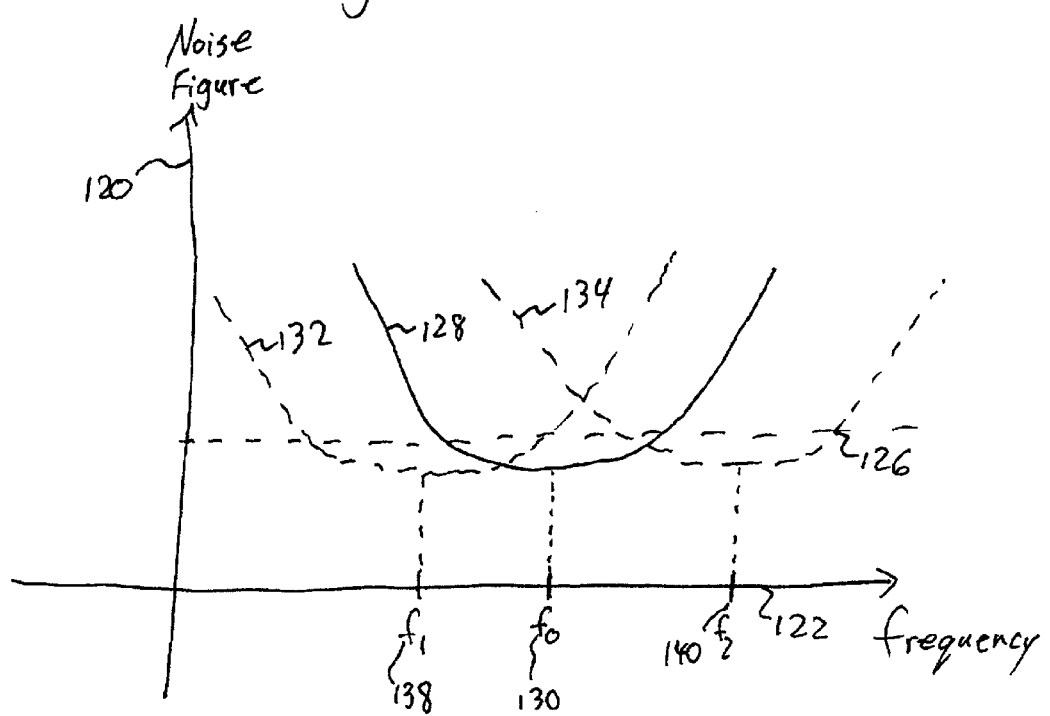

TUNABLE POWER AMPLIFIER MATCHING CIRCUIT

RELATED APPLICATIONS

This application claims the benefit of U.S. Provisional Application 60/283,093, filed Apr. 11, 2001, which is hereby incorporated by reference. In addition, this application relates to U.S. application Ser. No. 09/904,631 filed on Jul. 13, 2001, Ser. No. 09/912,753 filed on Jul. 24, 2001, Ser. No. 09/927,732 filed on Aug. 8, 2001, Ser. No. 09/927,136 filed on Aug. 10, 2001, "Tunable Capacitor," filed on Jan. 11, 2002, and "Antenna Interface Unit," filed on Feb. 8, 2002, which are hereby incorporated by reference.

BACKGROUND

Wireless communication devices, such as, but not limited to, wireless telephones, use many electronic components to transmit and receive signals over the air. A transceiver is the part of a wireless telephone that actually sends and receives signals. The front end of a transceiver is the portion of a transceiver closest to the air interface in the signal path. The front end includes an antenna and several components near the antenna in the signal path. Several of the components required in the front end of the transceiver are power amplifiers (PA's), isolators, low noise amplifiers (LNA's) and multiplexers. Each of these components are typically manufactured as packaged devices. In the case of a PA or an LNA, this package typically includes the active device and internal input and output matching circuits for bringing the input and output resistances up to an industry standard 50 ohms.

In one common embodiment, the packaged PA is comprised of a high performance FET (e.g., GaAs) placed on a ceramic or other substrate. Other active devices can be used, such as, for example, bipolar junction transistors (BJT's) and high electron mobility transistors (HEMT's). The matching circuits may be patterned on the ceramic substrate, or they may be fabricated using lumped surface mount technology (SMT) components. The FET is bonded to the package substrate, possibly to a metal heat sink, then typically connected to its input, output and bias pads using bond wires.

Depending on the requirements, multi-stage PA devices may be used as well. This means that one PA device may include more than one amplifying transistor. This may be necessary for a number of reasons. One possible reason is to produce the required gain. In the case of a multi-stage PA device, inter-stage impedance matching circuits may be used as well, to match between the output of one stage and the input of the following stage.

The inputs, outputs and bias lines to the FET are routed down to the ceramic substrate. After passing through the matching circuits, the input and output lines are routed off of the substrate down to the underlying printed wire board (made of FR-4 in most cases) through connectors on the PA package. Further wire bonding may be required to connect the package pads to the input, output and bias lines.

The package further comprises some kind of packaging (typically polymer) encasing, in whole or in part, the FET and the ceramic substrate holding the matching circuits. The input and output bias leads can be found at the edge of the packaging.

Isolators, duplexers, diplexers and low noise amplifiers (LNA's) are handled in much the same way. As packaged devices, they each have their separate substrates with their separate matching circuits bringing their input and output impedances to 50 ohms.

Most RF test equipment can only test parts at an impedance of about 50 ohms. Manufacturers and designers typically want to be able to test each part separately. Historically, the only way this could be done was if each part had input and output impedances of around 50 ohms. For this reason, parts, such as PA's and LNA's, for example, have typically been manufactured with impedances equal to about 50 ohms. This has required the use of extensive input and output matching circuits for many of these parts.

A duplexer is one of the primary components in a transceiver front end. The duplexer has three ports (a port is an input or an output). One port is coupled to an antenna. A second port is coupled to the transmit signal path of the transceiver. The duplexer couples the transmit path to the antenna, so that the transmit signal can be transmitted on the antenna.

A third port is coupled to the receive path of the transceiver. The antenna coupled the antenna to the receive path, so that the received signal can be received by the receive path of the transceiver.

An important function of the duplexer is to isolate the transmit signal from the receive path of the transceiver. The transmit signal is typically much stronger than the receive signal. Some of the transmit signal inherently gets down the receive path. But this transmit signal going down the receive path must be greatly reduced (or attenuated). Otherwise, the transmit signal going down the receive path will swamp, or overwhelm, the receive signal. Then the wireless telephone will not be able to identify and decode the receive signal for the user.

The required attenuation of the transmit signal going down the receive path is achieved at some expense. The duplexer also attenuates the transmit signal going to the antenna for transmission. This attenuation in the transmit signal going to the antenna is known as loss. It would be beneficial to reduce the transmit path loss in the duplexer.

Additionally, the duplexer typically must be large accomplish the receive path attenuation of the transmit signal. Consumers are continually demanding smaller and smaller wireless telephones with more and more features and better performance. Thus, it would be beneficial to reduce the size of the duplexer while maintaining or improving the transmit signal attenuation in the receive path and simultaneously maintaining or improving the transmit signal loss to the antenna.

SUMMARY

Transceivers account for a significant portion of the cost, size and power consumption of wireless communication devices. The front end, including antennas, duplexers, diplexers, isolators, PA's, LNA's and their matching circuits accounts for a significant portion of the cost, size and power consumption of the transceiver. It would be beneficial to reduce the cost, size and power consumption of these parts, individually and together.

Briefly, the present invention provides a ferro-electric tunable duplexer integrated with one or more of the other parts. This combination is referred to herein as an antenna interface unit. More specifically, in addition to adding F-E tunability, the present invention integrates one or more of the above components on one substrate. The components are integrated on one substrate either by placing each component, with the appropriate matching circuit directly on the substrate, or by direct fabrication of the component and matching circuit into or onto the substrate.

For example, in the case of integrating the PA, the isolator and the duplexer, the PA active device (e.g., GaAs FET) is placed directly onto the common substrate. As part of the integration of components, the matching circuits for the components may be patterned or placed on the common substrate. The matching circuits for the PA would be patterned or placed on this substrate. The isolator, if used, could be fabricated directly on this common substrate or mounted as a discrete component.

The matching circuit between the isolator and the duplexer would be patterned or fabricated on the substrate. The isolator would have its junction patterned on this substrate, with the ferrite puck, magnet and shield placed over it.

For purposes of integration, a stripline duplexer may be preferred as it would use the common substrate as one half of each resonator. Additionally, its length is shorter than a corresponding microstrip realization. Whatever type of duplexer is used, any coupling and tuning capacitors would be patterned on the common substrate. It will be understood that the same kind of integration can be carried out for the LNA, diplexer and antenna matching circuits. If minimum loss is a key requirement for a post PA BPF, duplexer or multiplexer, then a low loss substrate must be used as is well known to those skilled in the art.

The topology of the matching circuits would be typical matching circuit topologies with two key exceptions: (1) they would be integrated with the other parts and matching circuits on the common substrate and (2) they may comprise F-E tunable components, though they need not all comprise F-E tunable components. The PA and isolator matching circuits would typically be pi matching circuits (shunt capacitor, series inductor or microstrip line, shunt capacitor). The isolator typically uses series or shunt reactive circuits. The diplexer and duplexer matching circuits would typically be simply series input and output capacitors. The antenna matching circuit would be a pi or T circuit with L-C ladders creating a higher order matching circuit. Preferably, the duplexer would be as claimed in U.S. patent application Ser. No. 09/912,753 filed on Jul. 24, 2001.

BRIEF DESCRIPTION OF THE DRAWINGS

FIG. 4B is a schematic diagram of another multiband power amplifier matching circuit.

DETAILED DESCRIPTION OF PREFERRED EMBODIMENTS

Figure 1:
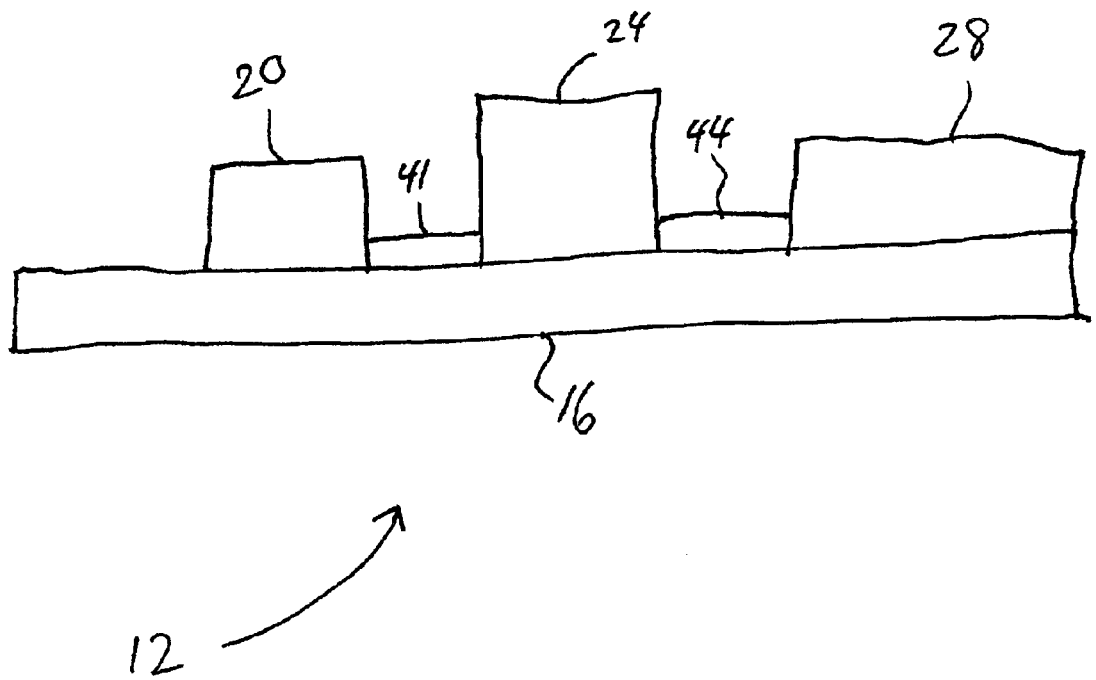
FIG. 1 is a block diagram of a side view of an antenna interface unit.

Referring now to FIG. 1, an integrated antenna interface unit (AIU) 12 is shown. While a duplexer is shown, as is common in a CDMA handset, a multiplexer could be used as well. While the description that follows specifies a duplexer throughout, it is to be understood that a multiplexer or BPF could be substituted for the duplexer. A PA unit 20, an isolator unit 24, and a duplexer 28 are all attached to a common substrate 16, eliminating the need for individual substrates for each of these components.

The substrate is preferably made of a carefully selected material. The substrate parameters that are typically critical are dielectric constant, loss tangent, thermal properties, cost and ease of processing. Typically, a dielectric constant should be less than about 40, and the loss tangent should be less than about 0.001 in the frequency range of interest. A low loss substrate may be more expensive than a higher loss substrate. A designer must frequently balance the issues of cost and performance parameters such as loss. Additionally, metal loss must also be minimized. A substrate must be chosen that can accommodate a low loss metal.

Advantages of integration of components with a multiplexer include: (1) reduction of the overall loss associated with the integrated device compared to that arising from using discrete parts, thus making it easier to meet specifications; (2) reduction of the footprint of the Tx chain in the sybsystem; (3) reduction of the overall parts count, especially as far as a manufacturer of a wireless communication device is concerned; (4) reduction of cost due to reduced packaging and parts count, (5) integration of f-e tunable components with lower added loss and occupying less space than if introduced as individual, lumped element components.

A PA-to-isolator matching circuit 41, disposed on the substrate 16, couples the PA unit to the isolator unit 24. An isolator-to-duplexer matching circuit 44, disposed on the substrate 16, couples the isolator to the duplexer.

Preferably, an isolator is used, but it is optional. If no isolator is used, it will be understood that the isolator is removed and the PA-to-isolator matching circuit and the isolator-to-duplexer matching circuit is replaced by a PA-to-duplexer matching circuit. There are two main reasons a designer will choose to use an isolator in a design such as disclosed herein. The reasons are: (1) To provide a certain load impedance to the device preceding the isolator (the PA in this case); and (2) To prevent unwanted signals from propagating back into the device preceding the isolator (the PA in this case). Unwanted signals propagating back to the PA can cause unacceptable mixing or distortion or both to be created which can render the overall design unacceptable.

As is well known in the art, there are many cases where the isolator can be eliminated. This is true when: (1) The PA can be presented an acceptable load under operating conditions; or (2) The isolator can be replaced by a suitable coupler or passive hybrid device that reduces the effect of reverse power propagation on the desired signal path. Passive couplers or passive hybrid couplers can be more easily implemented by direct fabrication on the substrate as outlined in this application.

This particular configuration of the AIU 12 is shown and described in detail for purposes of example and illustration only. The AIU 12 may not include a PA 20 or an isolator 24. As will be described more generally with reference to FIGS. 8–13, the AIU always has a tunable multiplexer and some other component on a common substrate. Other than that, there are many possible components that can be integrated with the multiplexer to form the AIU. The PA and isolator are just two examples.

Also, the PA may include multiple active devices. This is called a multi-stage PA. The discussion will be in terms of one active device, but it will be understood by those skilled in the art that this discussion could be applied to multi-stage PA's.

Since the matching circuits and components are on a common substrate 16, the impedance matches do not have to be to the industry standard 50 ohms. Instead, the impedance match can be from the natural output impedance, $Z_o$, of one component to the natural input impedance, $Z_i$, of the next component.

For example, referring again to FIG. 1, if the PA unit 20 has an output impedance of about 2.5 ohms and the isolator unit 24 has an input impedance of about 12.5 ohms, the PA-to-isolator matching circuit 41 will match the impedance from 2.5 ohms at the PA unit 20 to 12.5 ohms at the isolator unit 24. This is in contrast to the prior art. In the prior art, the PA unit would typically have its own substrate, and the isolator unit would typically have its own substrate. The PA unit would have its own matching circuit which would match from the output of the PA (e.g., 2.5 ohms) up to 50 ohms. The isolator unit would have its own matching circuit which would match from 50 ohms down to the isolator (e.g., 12.5 ohms). There would be additional loss in the signal in this match up to 50 ohms from 2.5 ohms and back down to 12.5 ohms from 50 ohms.

A further advantage in matching from the natural ouput impedance of one device to the natural input impedance of another device is that a simpler topology in the matching network may often be used when Zo and Zi are closer in value than they are to the industry standard 50 ohms, for example. A simpler matching network will result in less added variation due to component variation than does a more complex network. In the limit where, for example, Zo=Zi, no matching network is needed between adjacent devices in the signal path. In the prior art, each device is typically matched to the industry standard 50 ohms.

Referring again to FIG. 1, the duplexer 28 is a low loss tunable duplexer, as described in U.S. patent application Ser. No. 09/912,753 filed on Jul. 24, 2001. Ferro-electric components such as ferro-electric capacitors are used to tune the duplexer.

The integrated antenna interface unit has significantly less loss in the transmit path than non-integrated transmit chains. Integrating components, the PA, for example, eliminates lossy attachments, which are described in U.S patent application Ser. No. 09/912,753 filed on Jul. 24, 2001. Specifically, an electrical connection between the PA substrate and the common substrate is eliminated. In the prior art, the PA is typically manufactured on its own substrate. When a communication device is made, incorporating the PA, an electrical connection must be made between the PA substrate and the common substrate. Whether this is accomplished by surface mount technology (SMT), hand soldering, wire bonding, or some other attachment method, attachment losses are added. By mounting the PA directly on the common substrate, these losses are avoided.

Figure 2:
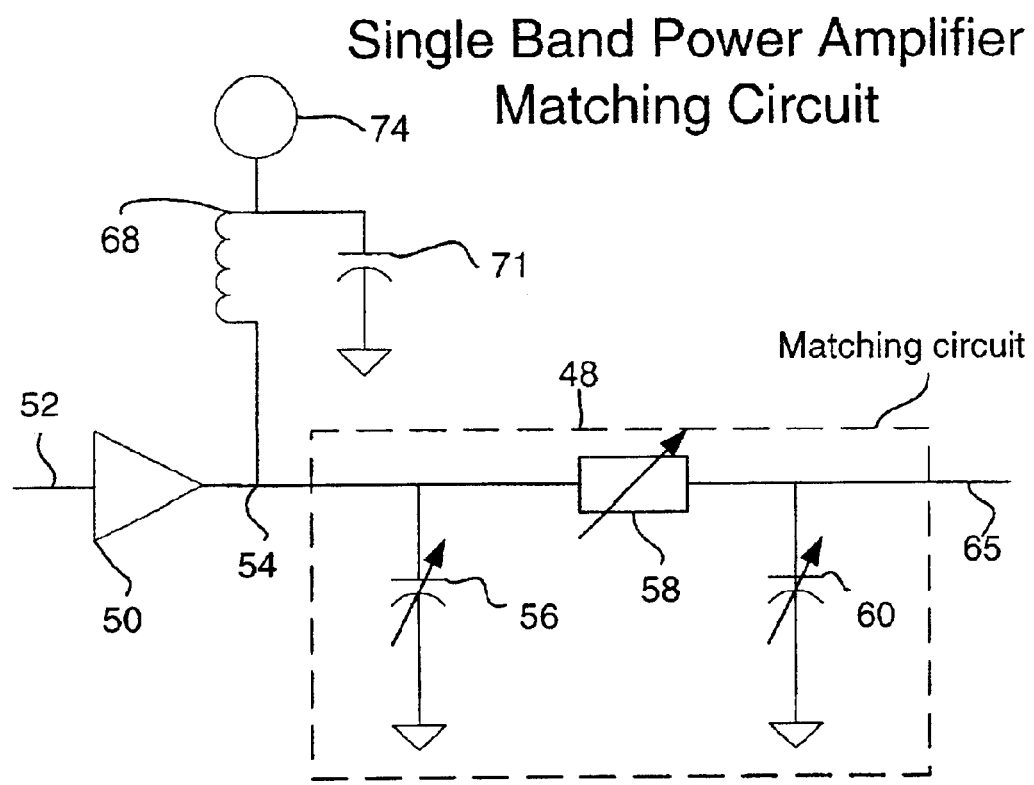
FIG. 2 is a schematic diagram of a power amplifier matching circuit.

Referring now to FIG. 2, a PA matching circuit 48 is shown. A PA 50 has an input 52 and an output 54. In a preferred embodiment, the output 54 is coupled to a first capacitor 56. The first capacitor 56 is also coupled to ground. The output 54 is also coupled to an inductive element 58. The inductive element 58 may be a lumped element inductor, a microstrip line, or any other inductive element known in the art. The inductive element 58 is also coupled to a second capacitor 60. The junction between the inductive element 58 and the second capacitor 60 forms the output 65 of the PA matching circuit 48. The output 54 of the PA 50 is also coupled to a bias circuit. The bias circuit typically comprises an inductor 68, a third capacitor 71 and a voltage source 74.

Figure 3:
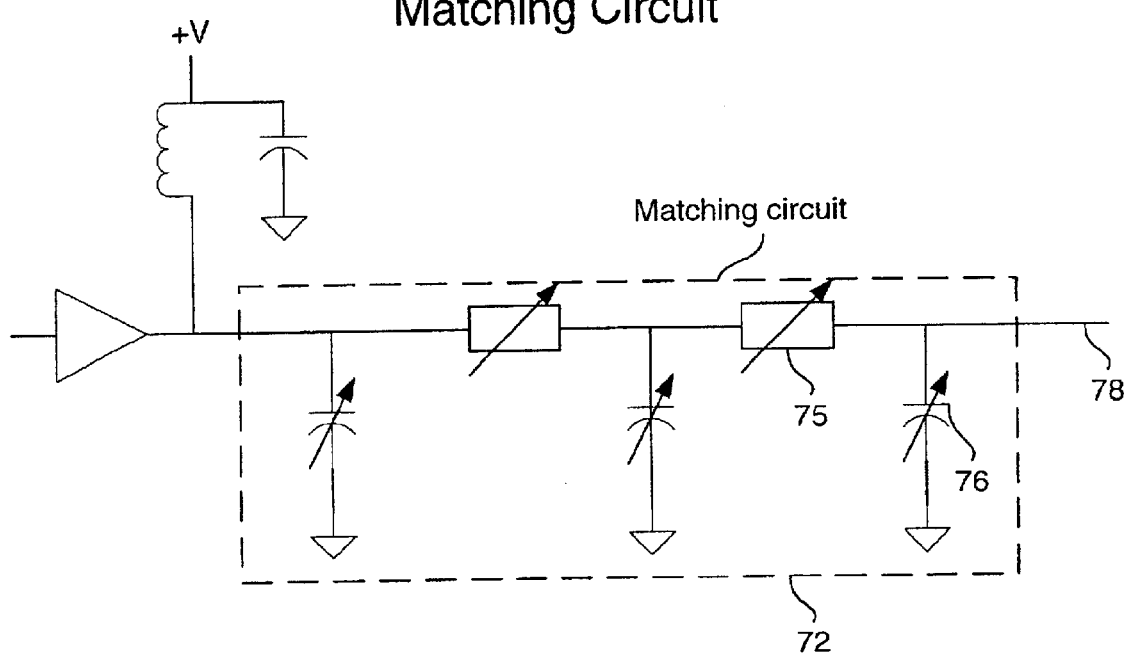
FIG. 3 is a schematic diagram of an extended power amplifier matching circuit.

Another example matching circuit topology is shown in FIG. 3. The matching circuit 72 is similar to the matching circuit 48 shown in FIG. 2, except that the matching circuit 72 in FIG. 3 has an additional inductive element 74 and an additional capacitor 76. Also, the output 78 of this matching circuit 72 is at the junction of the inductive element 74 and the capacitor 76. Any or all of the inductive and capacitive components may be tunable.

It will be understood by those of skill in the art that different matching circuit topologies might be used to implement the PA matching circuit. In general a more complex matching circuit will allow for greater control in the match at the expense of added insertion loss (I.L.) due to finite component Q, as well as greater cost and increased board space.

Referring again to FIG. 1, the PA is placed directly on the substrate 16, and the matching circuit described with reference to FIG. 2 is fabricated directly on the substrate 16. The capacitors may be fabricated directly on the substrate 16 as interdigital capacitors, gap capacitors or overlay capacitors, as is well known in the art. By fabricating the PA unit 20, the PA-to-isolator matching circuit 41 and the isolator unit 24 directly on the same substrate 16, attachment losses are avoided, in addition to the previously described losses resulting from matching impedances up to and back down from 50 ohms. In the prior art, the separate substrates for the PA unit and the isolator unit must be attached electrically and mechanically to a common substrate or board. There are losses associated with attachment of these additional substrates. Finally, there is additional loss in the electrical line connecting the separate substrates on the common substrate or board. By combining the PA and isolator onto a common substrate these losses are eliminated or significantly reduced.

Referring again to FIG. 2, the capacitors 56 and 60 may be tunable, using low loss tunable ferro-electric materials and methods as described in U.S. patent application Ser. No. 09/912,753 filed on Jul. 24, 2001, and Ser. No. 09/927,136 filed on Aug. 10, 2001, hereby incorporated by reference. This would reduce the loss even further, by providing for an optimum impedance match. The matching circuits shown in FIGS. 2 and 3 are used to match a single band, such as the PCS band, or the cellular band. Presently, these matching circuits can achieve a tunability of at least 15%.

This allows for tuning even over several international PCS bands, such as from the India PCS band to the U.S. PCS band. To tune over a wider frequency, for example, from the U.S. PCS band at about 1900 MHz to the U.S. cellular band at about 800 MHz, the PA-to-isolator matching circuit has to have more tunability.

For tuning a PA over more than one PCS band, the input matching circuit may need tuning as well. Whether tuning the input matching circuit is necessary or not can be determined on a case by case basis. The same technique as used for the output matching circuit is used in this case.

Figure 4A:
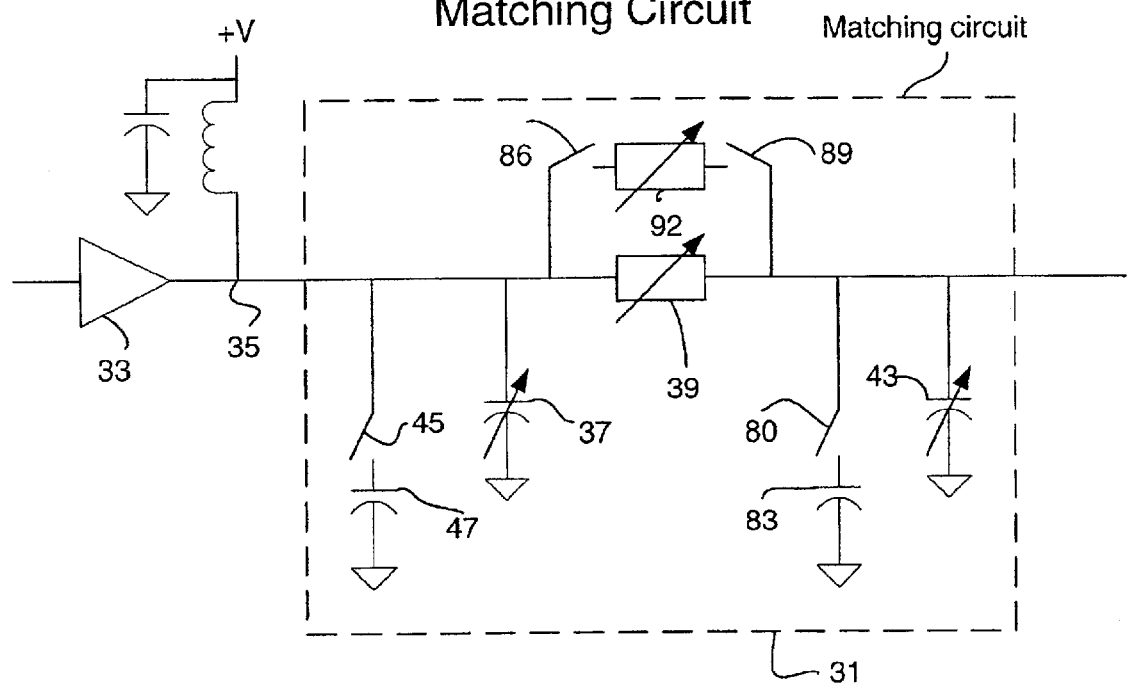
FIG. 4A is a schematic diagram of a multiband power amplifier matching circuit.

Increased tunability is attained by adding micro-electromechanical switches (MEMS) to the matching circuit. Referring now to FIG. 4A, a multiband PA matching circuit 31 is shown. The matching circuit 31 is similar to that of FIG. 2, except that several additional components have been added, with the ability to switch those components in and out of the circuit 31 with MEMS. The output 35 of a PA 33 is coupled, as in FIG. 2, to a first capacitor 37 and to a first inductive element 39. The first inductive element 39 is coupled to a second capacitor 43. But here, the output 35 of the PA 33 is also coupled to a first MEMS 45 for selectively coupling to a third capacitor 47. The first inductive element 39 and the second capacitor 43 are also coupled to a second MEMS 80 for selectively coupling to a fourth capacitor 83. These switches 45 and 80 and capacitors 47 and 83 change the capacitance of the matching circuit 31.

Additionally, the first inductive element 39 is coupled at either end to MEMS 86 and 89 for selectively coupling to a second inductive element 92. These switches 86 and 89 and inductive element 92 change the inductance of the matching circuit 31. In this way, the matching circuit 31 can be used to match the PA 33 for use at either cellular or PCS bands. It will be understood that the techniques and devices described here could be used to match at other bands than the cellular and PCS bands. The cellular and PCS bands are chosen as examples. It will also be understood that other matching circuit topologies can be chosen.

Referring again to FIG. 4A, a multi band PA matching circuit 31 is shown which is similar to the single band PA matching circuit described with reference to FIG. 2. As stated the multi band PA matching circuit 93 has an advantage in that it is tunable over a broader range of frequencies, due to the addition of MEMS switches 86, 89, 45 and 80 and accompanying components. Tunable capacitors 37 and 43 and tunable reactive element 39 can be used to fine tune over a specific frequency band. The specific band is selected by MEMS switches 86, 89, 45, and 80.

In addition to MEMS switches 86, 89, 45, and 80, the multi band PA matching circuit 93 has additional capacitors 47 and 83 and an additional reactive element 92. Capacitor 83 is connected in series with capacitor 43 and in series with MEMS switch 80. When it is desired to switch to another band, such as, for example, another PCS band, MEMS switch 80 is activated, coupling capacitor 83 to capacitor 43 and reactive element 39 for changing the impedance of matching circuit 93. Similarly, MEMS switch 45 can be activated to couple capacitor 47 to capacitor 37 and reactive element 39 for changing the impedance of matching circuit 93. Also similarly, MEMS switches 86 and 89 can be activated to couple reactive element 92 in parallel to reactive component 39 for changing the impedance of matching circuit 93.

An alternative configuration of reactive components 92 and 39 and MEMS switches 86 and 89 is shown in FIG. 4B. In FIG. 4B MEMS switches 86 and 89 are coupled to reactive elements 92 and 39 such that only one of reactive elements 92 and 39 is coupled to capacitors 37 and 43. Reactive element 39 can be switched out of the circuit, so that it is disconnected at both ends, whereas, in FIG. 4A, reactive element 39 is always coupled to the circuit at capacitors 37 and 43. Reactive element 92 only is switched in and out of the circuit. Note that in both FIGS. 4A and 4B any of the elements 92, 39, 47, 37, 83 and 43 may be tunable. At least one is tunable, but as few as one, or all of them, may be tunable.

For handset applications, the MEMS switches described here should have the lowest practical loss, e.g., DC resistance less than about 0.01 ohms. Switching speed is not critical so long as it is less than about 1.0 ms. Clearly, other applications may require other critical specifications on the MEMS switches.

Figure 5:
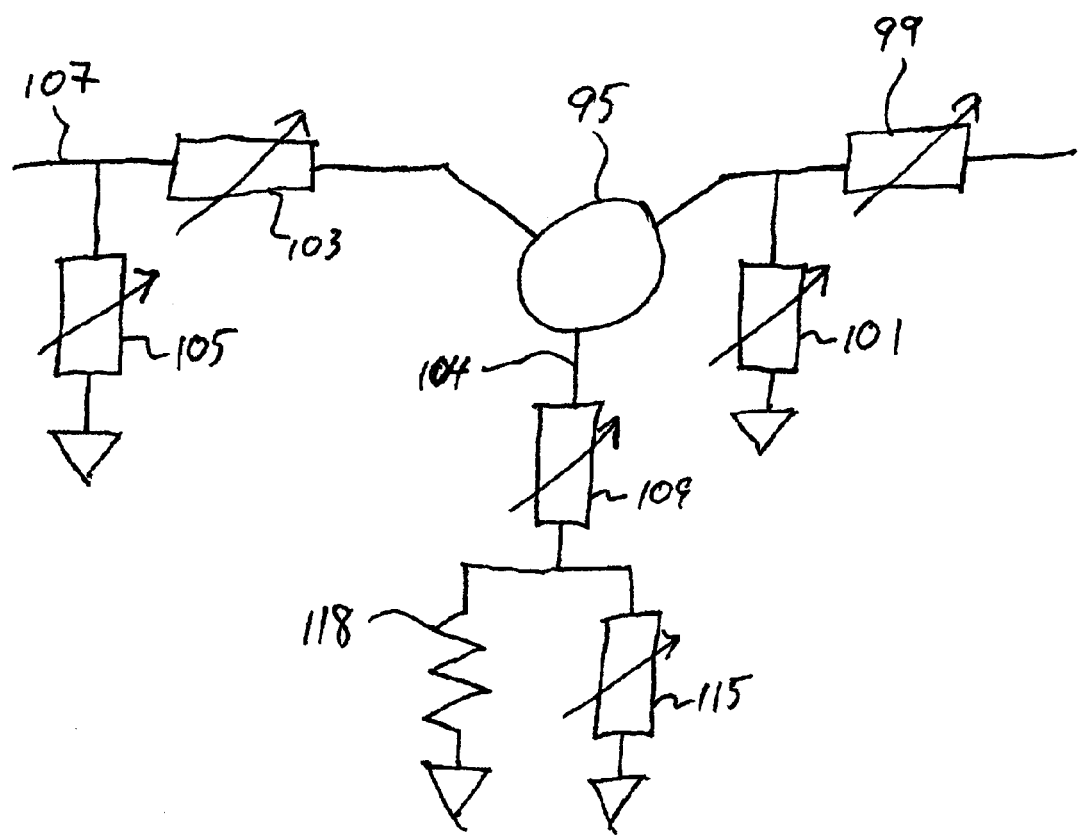
FIG. 5 is a schematic diagram of an isolator and its three matching circuits.

Referring now to FIG. 5, an isolator matching circuit will now be described. An input port 97 is coupled to a PA (not shown), to a first impedance element 99 and to a second impedance element 101. The first and second impedance elements 99 and 101 form an input matching circuit for the isolator 95. The second impedance element 101 is coupled to ground, and the first impedance element 99 is couple to the isolator 95 for transmitting a signal from a PA (not shown) to the isolator 95. Both the first and second impedance elements may be ferro-electric tunable components, as described in U.S. patent application Ser. No. 09/927,136 filed on Aug. 10, 2001.

An output of the isolator 95 is coupled to a third impedance element 103, which is coupled to a fourth impedance element 105. The third and fourth impedance elements 103 and 105 together form an output matching circuit and an output port 107 for the isolator 95. The output port 107 is coupled to a duplexer (not shown). Both the third and fourth impedance elements may be ferro-electric tunable components, as described in U.S. patent application Ser. No. 09/927,136 filed on Aug. 10, 2001.

An isolation port 104, is coupled to an impedance element 109. The impedance element 109 is coupled to another impedance element 115 and to a resistor 118. Together the impedance elements 109 and 115 and the resistor 118 comprise an isolation matching circuit.

It will be understood by one of skill in the art that the input, output and isolation matching circuits described with reference to FIG. 5 using "L" matching sections are illustrative only. Other topologies for these matching circuits could be used, such as, for example, parellel LC circuits, "T", or Pi networks, as described in U.S. patent application Ser. No. 09/927,136 filed on Aug. 10, 2001.

Advantageously, each of the impedance elements 99, 101, 103, 105, 109, and 115 are preferably formed directly on the common substrate described with reference to FIG. 1. This reduces losses associated with attaching separate units to the substrate, reduces cost and eliminates the need to match components up to the 50 ohm industry standard.

Regarding the PA, its characteristic output impedance for CDMA handsets is typically about 2–4 ohms near the maximum output power level required of it. The isolator characteristic impedance is typically about 8–12 ohms. Filters can be designed with input and output impedances that can take on a broad range of values. Since duplexers and diplexers are made primarily of filters, they can be designed to allow for a broad range of input and output impedances. Thus, they can be designed to match to whatever impedance is convenient based on the rest of the circuit.

Figure 6A:
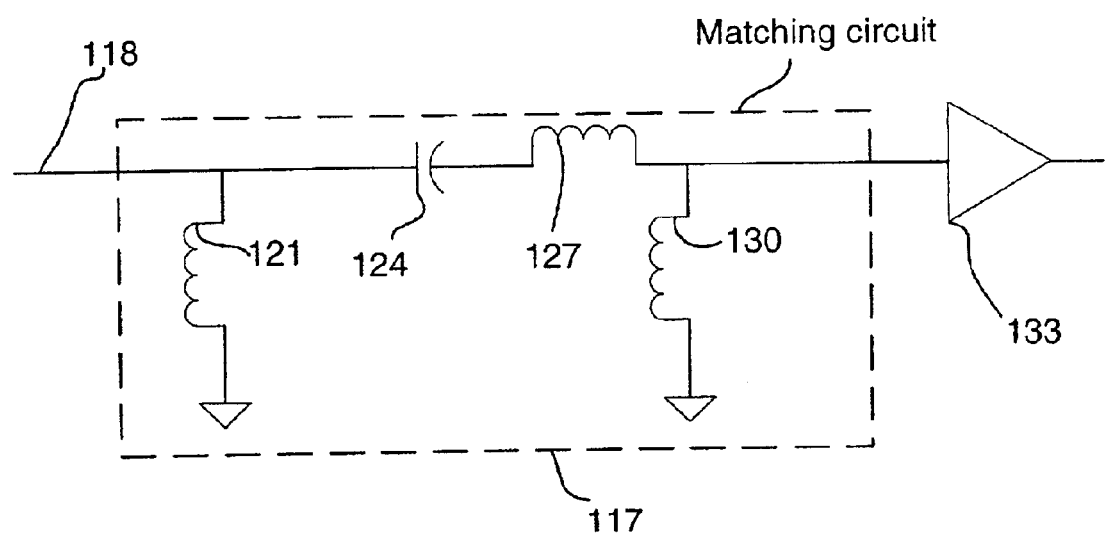
FIG. 6 is a schematic diagram of a LNA matching circuit.
FIG. 6B is a graph of a LNA noise figure response.

Referring now to FIG. 6A, a preferred LNA matching circuit 117 will now be described. An input port 118 is coupled to a first inductor 121 and to a capacitor 124. The capacitor is coupled to a second inductor 127. The second inductor 127 is coupled to a third inductor 130 and to an LNA 133.

The matching circuits will be used to match the impedance between the various parts to avoid or reduce power loss in the signal travelling from one part to the other. For LNA applications, there is another purpose. For LNA applications, impedance transforming networks or circuits are used primarily to maintain an optimum noise impedance match between the input signal source and the active device chosen for the LNA. In fix-tuned circuits, the optimum noise impedance match is obtained at one frequency and is dependent on both temperature and component variations. In the tunable circuit approach described here, the optimum noise impedance match can be made adjustable to cover multiple bands or a wider frequency range than is possible in the fix-tuned case. An added advantage in using tunable components is the ability to compensate for temperature variations.

The introduction of f-e or other tunable components allows for increased flexability in the design of LNA's. In the conventional design using fixed elements, one must usually trade-off optimum noise figure and maximum gain. With tunable components, one can allow for cases where the input matching circuit can be varied from the minimum noise figure and the maximum gain, as desired.

A tunable optimum noise figure will now be described with reference to FIG. 6B. FIG. 6B is a graph showing noise figure 120 plotted against frequency 122. Typically, such as, for example, in a CDMA wireless communication device, there will be a maximum noise figure 126 specified for a given design of an LNA. The maximum noise figure specified is shown as a horizontal dashed line 126. A curve showing a typical noise figure response 128 is shown as the solid curve.

Typically, the LNA and its matching circuits will be designed so that the noise figure response 128 will be below the maximum noise figure 126 at an operating frequency, $f_o$ 130. A tunable LNA matching circuit allows the LNA noise figure response 128 to be tuned over frequency. The tuned noise figure response 132 and 134 is represented by two dashed curves of a similar shape to that of the typical noise figure response 128. By tuning the noise figure response at 132 and 134, the noise figure response can be made to be below the maximum noise figure 126 at alternate operating frequencies $f_1$ 138 and $f_2$ 140. It will be understood that $f_1$ 138 and $f_2$ 140 are chosen as representative frequencies only. The noise figure response can be tuned over a broad range of frequencies. Additionally, it will be understood by one of skill in the art that MEMS switches can be added to the LNA matching circuit to further broaden the range of tunability of the noise figure response.

Figure 7:
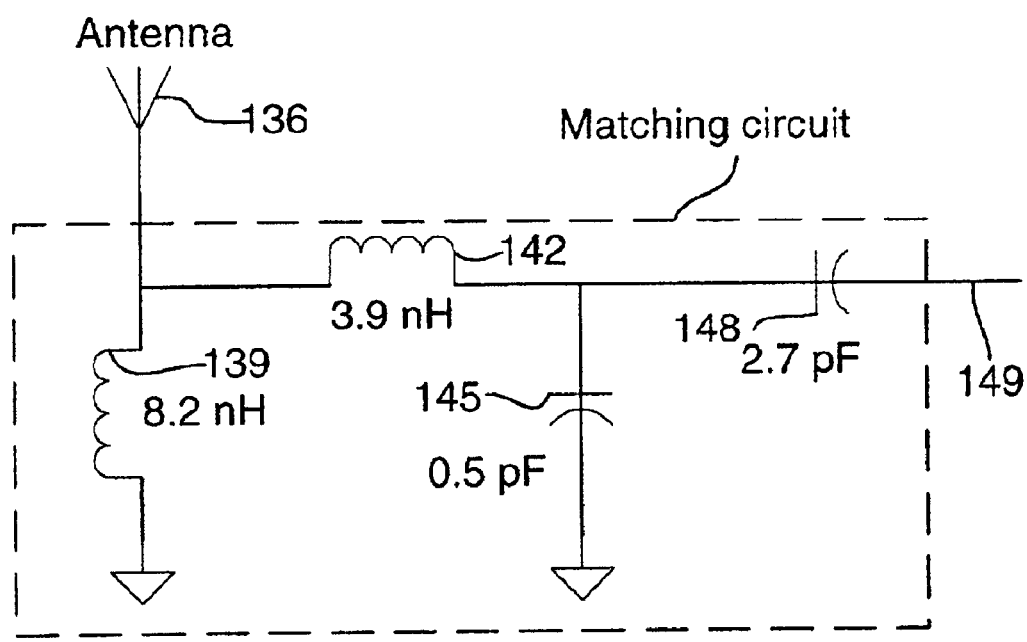
FIG. 7 is a schematic diagram of an antenna matching circuit.

Referring now to FIG. 7, a preferred antenna matching circuit will now be described based on a CDMA handset. An antenna 136 is coupled to a first inductor 139 and to a second inductor 142. The first inductor 139 preferably has an inductance equal to about 8.2 nH. The second inductor 142 preferably has an inductance equal to about 3.9 nH.

The second inductor 142 is coupled to a first capacitor 145 and a second capacitor 148. The first capacitor 145 preferably has a capacitance equal to about 0.5 pF. The second capacitor 148 preferably has a capacitance equal to about 2.7 pF. It will be understood that other component values and matching circuit topologies can be used.

One side of the second capacitor forms an input and output port 149 for the antenna matching circuit for coupling to a duplexer (not shown), diplexer (not shown), multiplexer (not shown) or other type of filter (not shown).

The antenna matching circuit will typically be a pi or T circuit with an L-C ladder making it a higher order match. This gives more tolerance for impedance variation. Typically, the antenna in a system will be matched to 50 ohms. There may be, however, an ideal impedance for a given antenna that is other than 50 ohms, though 50 ohms is common for test devices.

For example, a commonly used antenna for wireless communication devices may have an input impedance of 30 ohms. As previously mentioned, the PA may have an ouput impedance of about 2 ohms. The isolator may have an ouput impedance of about 12.5 ohms. The diplexer and duplexer filters can easily accommodate a wide range of impedances.

So the PA-to-isolator match is from about 2 ohms at the PA to about 12.5 ohms at the isolator. The isolator-to-duplexer match is from about 12.5 ohms to about 12.5 ohms. The duplexer is at about 12.5 ohms. So the duplexer-to-diplexer match is about 12.5 to about 12.5 ohms. The diplexer and duplexer inputs and outputs are at about the same impedance, for example, about 12.5 ohms. The diplexer-to-antenna matching circuit may be a match from about 12.5 ohms at the diplexer to about 30 ohms at the antenna. Each of these matching circuits, plus the diplexer and the duplexer may be f-e tunable.

Figure 8:
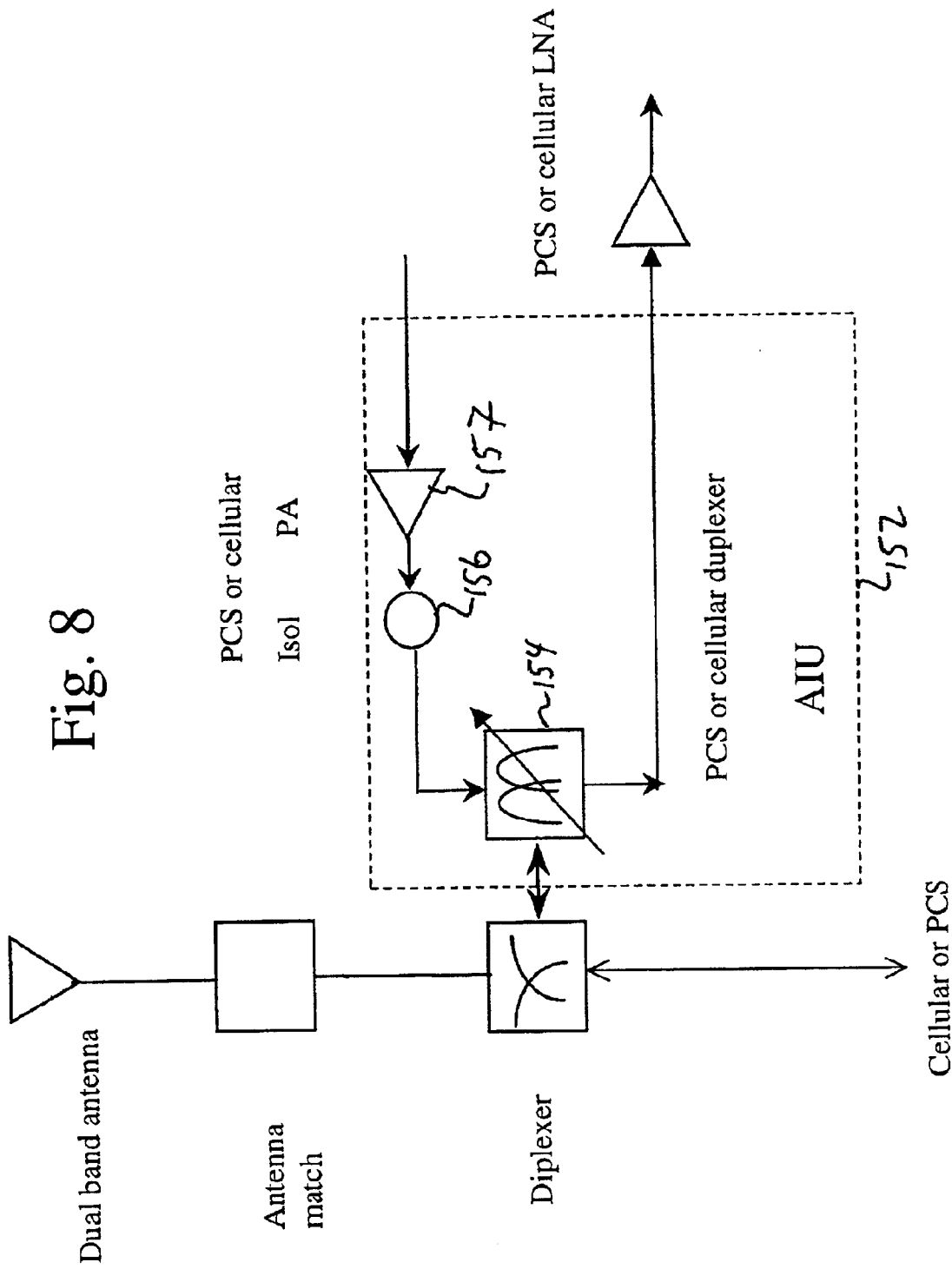
FIG. 8 is a block diagram of an antenna interface unit.
Figure 9:
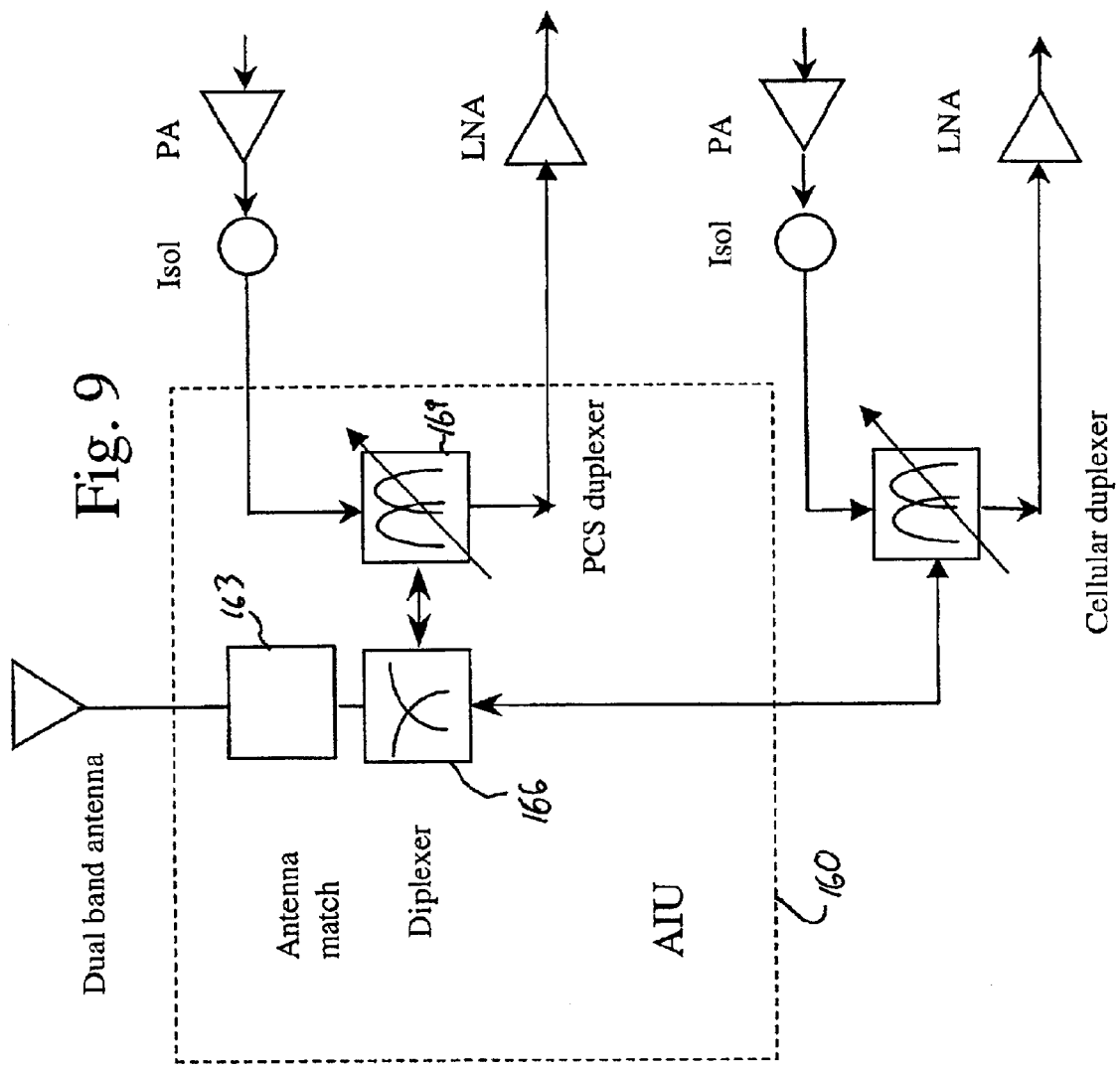
FIG. 9 is a block diagram of an antenna interface unit.
Figure 10:
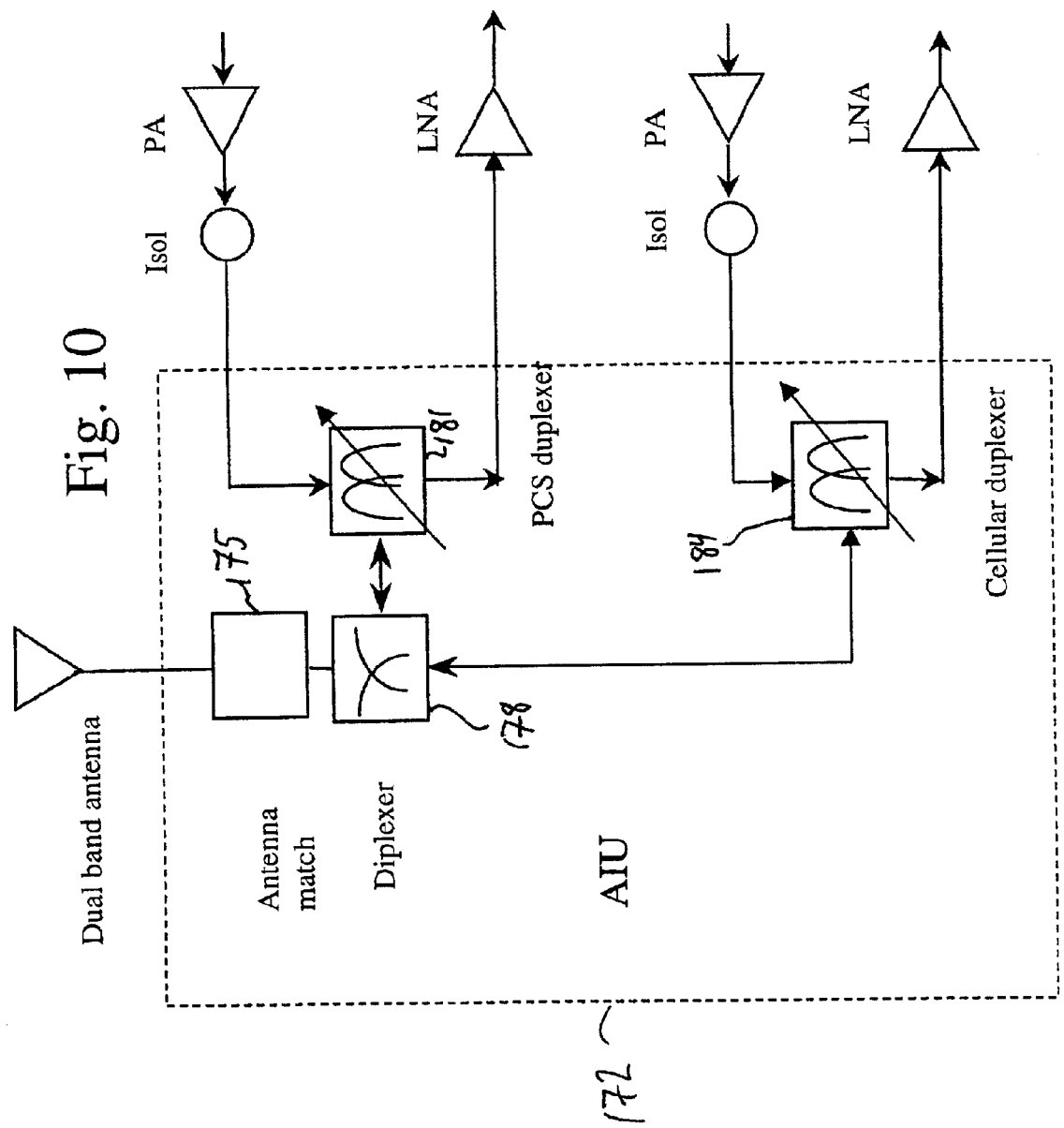
FIG. 10 is a block diagram of an antenna interface unit.
Figure 11:
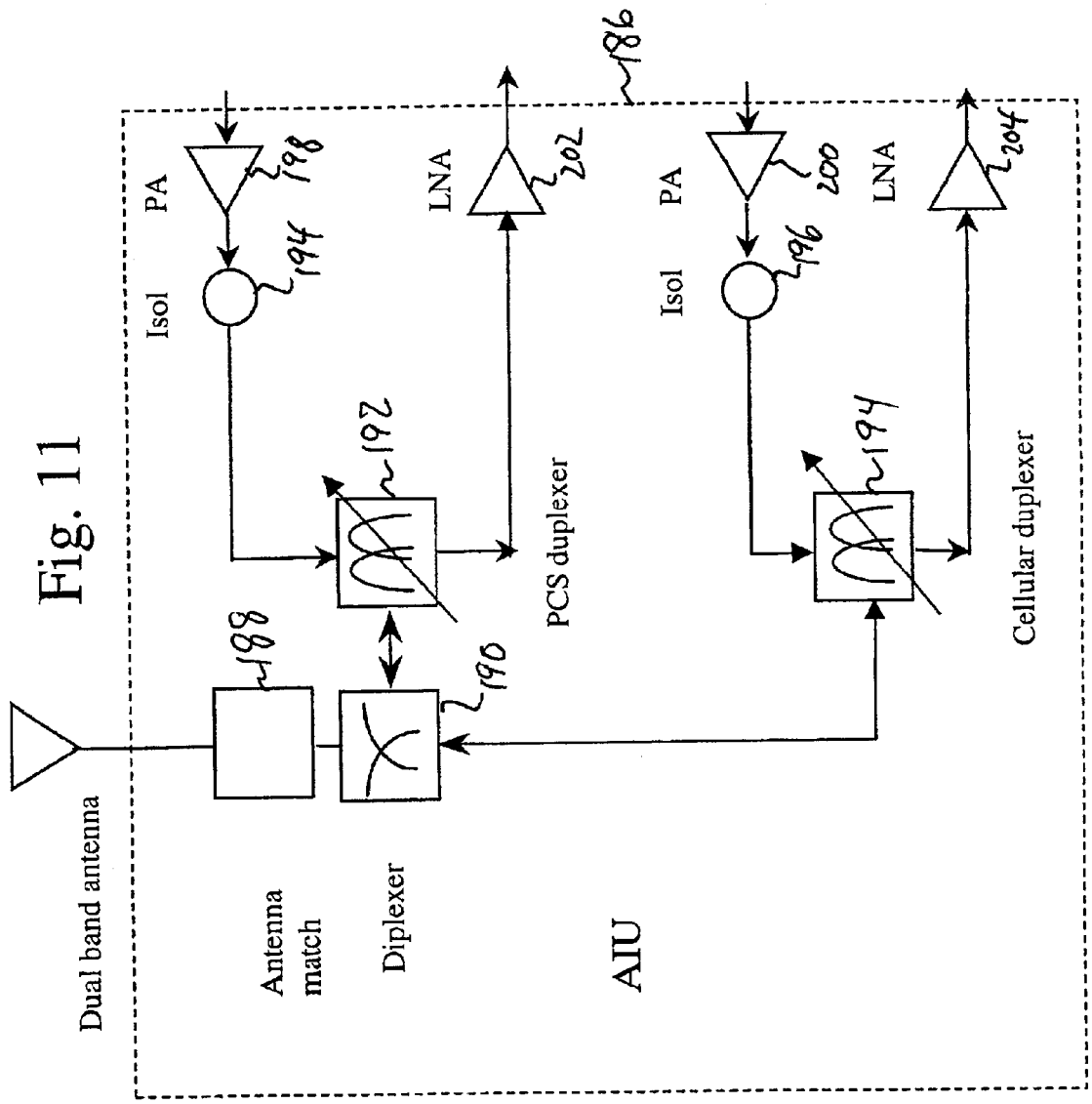
FIG. 11 is a block diagram of an antenna interface unit.
Figure 12:
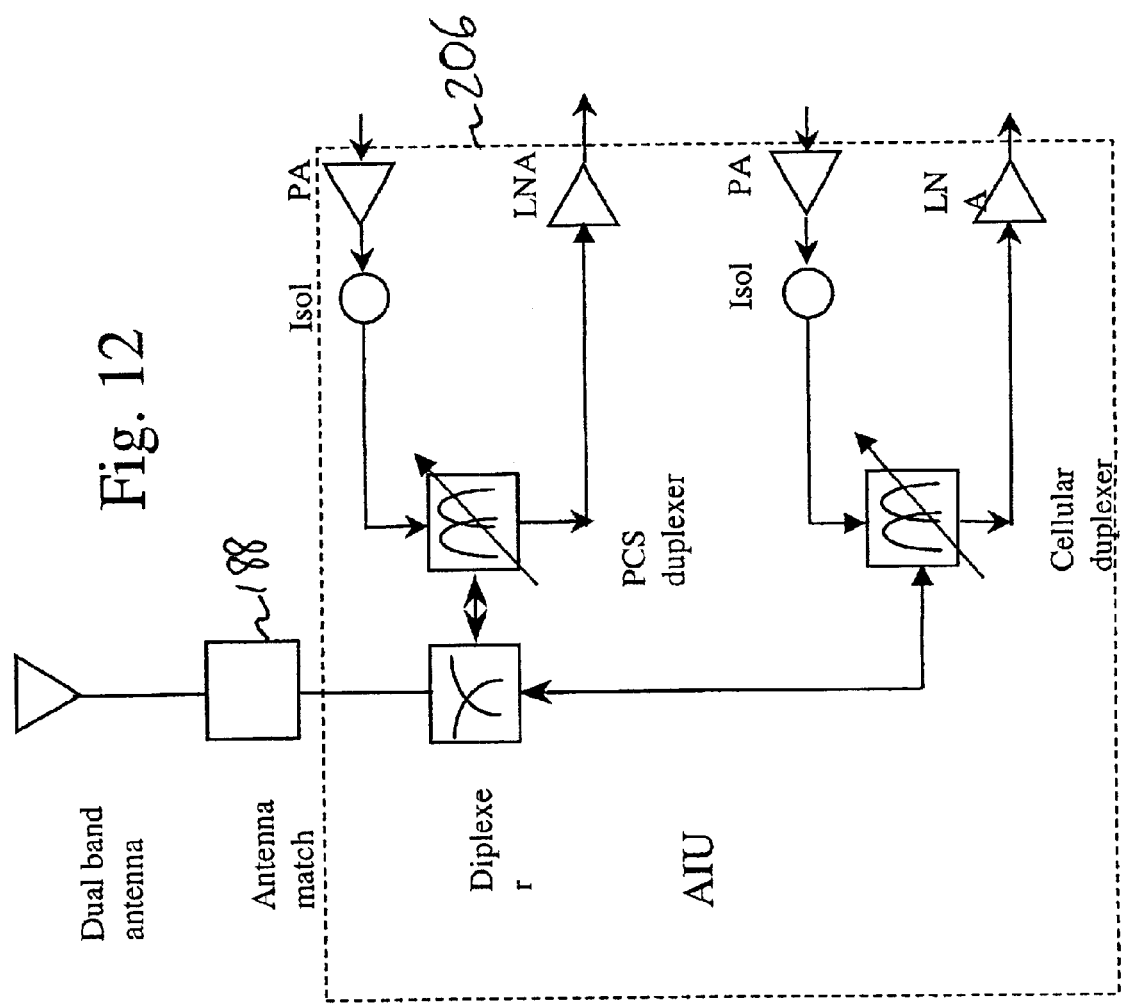
FIG. 12 is a block diagram of an antenna interface unit.
Figure 13:
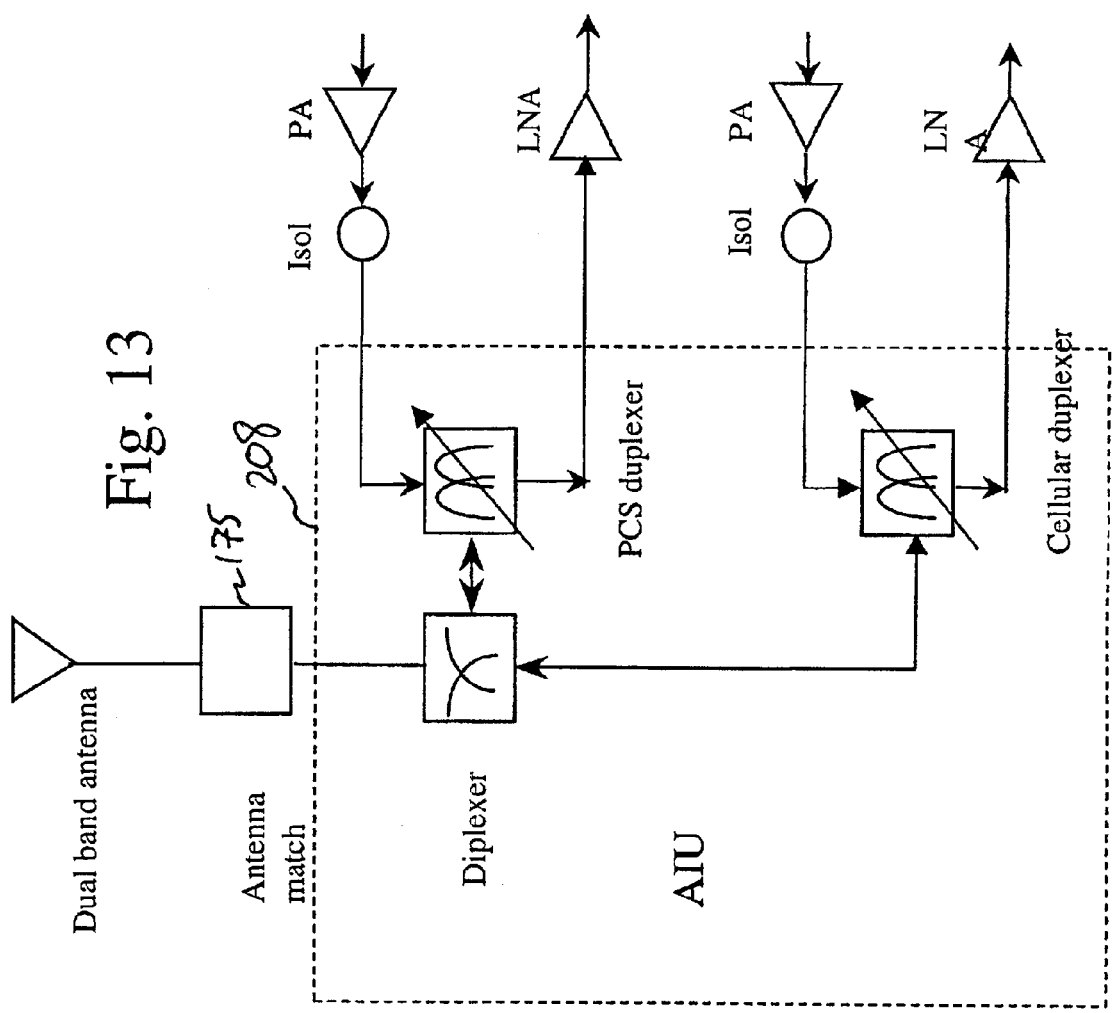
FIG. 13 is a block diagram of an antenna interface unit.

At mentioned above with reference to FIG. 1, it will be understood that a common substrate may include many different combinations of the parts mentioned above. In one embodiment, as shown in FIG. 8, a common substrate 152 includes a duplexer 154, an isolator 156, a PA 157 and the requisite matching circuits (not shown). In another embodiment, as shown in FIG. 9, a common substrate 160 includes an antenna matching circuit 163, a diplexer 166 and a duplexer 169. In yet another embodiment, as shown in FIG. 10, a common substrate 172 includes an antenna matching circuit 175, a diplexer 178 and two duplexers 181 and 184. In still another embodiment, as shown in FIG. 11, a common substrate 186 includes an antenna matching circuit 188, a diplexer 190, two duplexers 192 and 194, two isolators 194 and 196, two PA's 198 and 200 and two LNA's 202 and 204. In another embodiment, as shown in FIG. 12 a common substrate 206 includes everything mentioned above with reference to FIG. 11, except the antenna matching circuit 188. In another embodiment, as shown in FIG. 13 a common substrate includes everything mentioned above with reference to FIG. 10, except the antenna matching circuit 175.

The integration of a PA module, isolator and duplexer for a CDMA TX chain removes the requirement that each stand-alone device be matched at 50 ohms at the input and output. By allowing for a more gradual impedance match (from about 2 ohms to about 30 ohms in the example given) one can reduce match-induced losses. Additionally, the f-e tunable components are exposed to a lower rf voltage, for a given power.

The reduced rf voltage, for a given power, reduces non-linear distortion, because f-e films are typically non-linear. Alternatively, a f-e component can be subjected to increased power while maintaining an acceptable level of non-linear distortion. Thus, designing integrated components that operate at lower input and output impedances allows for f-e components to be incorporated in applications where higher power levels are required than possible with f-e components matched to the industry standard 50 ohms.

Fabrication on a common substrate further reduces losses that naturally arise when the components involved are packaged and mounted individually on a printed wire board (pwb).

By reducing Tx chain losses the Tx chain specifications can more easily be satisfied. This means that the specification for one or more of the parts involved can be relaxed. For example, the PA or other high value part specifications can be relaxed. A high value part is a part with one or more of the following characteristics: high cost, high performance, high level of difficulty in meeting specifications such as gain, power out, stability, ACPR, over temperature, and unit-to-unit repeatability.

Since the specifications on the PA, for example, can be relaxed, there are many possible benefits. For example, the PA may be able to meet specifications while consuming less power. This results in longer talk times or longer standby times or both. In another example, since Tx chain losses are reduced, a wireless handset manufacturer may be able to meet specifications with a PA that has less stringent tolerances or requirements. The handset manufacturer may be able to choose a cheaper PA, reducing the cost of wireless handsets. These benefits of reduced Tx chain losses are given as examples only. It will be understood by those skilled in the art that other benefits will arise from reduced Tx chain losses. It will further be understood that these benefits can be utilized to improve wireless communication devices in ways other than those mentioned here.

What is claimed is:

1. A tunable power amplifier comprising:

a power amplifier;

a ferro-electric tunable component coupled to the power amplifier;

a power amplifier output matching circuit coupled to the power amplifier, having an impedance and comprising the ferro-electric tunable component;

a control line operably coupled to the ferro-electric component;

a control source electrically coupled to the control line, the control source configured to transmit a control signal on the control line;

wherein the ferro-electric component, responsive to the control signal, adjusts the impedance of the matching circuit; and wherein the matching circuit comprises:

a first tunable ferro-electric capacitor coupled at a first end of the first capacitor to an output of the power amplifier and to ground at a second end of the first capacitor;

an inductive element coupled at a first end of the inductor to the first tunable capacitor and to the power amplifier, and;

a second tunable ferro-electric capacitor coupled, at a first end of the second capacitor to a second end of the inductive element and to ground at a second end of the second capacitor;

wherein, the ferro-electric component comprises one of the ferro-electric tunable capacitors;

a second inductive element coupled at a first end of the second inductive element to the second end of the first inductive element; and a third ferro-electric tunable capacitor coupled at a first end of the third capacitor to a second end of the second inductive element and at a second end of the third capacitor to ground.

2. The tunable power amplifier of claim 1, wherein the second inductive element comprises a lumped element inductor.

3. The tunable power amplifier of claim 1, wherein the second inductive element comprises a microstrip.

* * * * *